United States Patent
Nam et al.

(10) Patent No.: US 7,166,183 B2
(45) Date of Patent: Jan. 23, 2007

(54) APPARATUS AND METHOD FOR TREATING EDGE OF SUBSTRATE

(75) Inventors: Chang-Hyeon Nam, Kyunggi-do (KR); Seung-Kim Lee, Kyungki-do (KR); Man-Young Lee, Kyungki-do (KR); Yoon-Kyung Kim, Kyungki-do (KR); Han-Yong Chae, Kyungki-do (KR); Duk-Min Ahn, Kyungki-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/884,533

(22) Filed: Jul. 2, 2004

(65) Prior Publication Data
US 2005/0000652 A1    Jan. 6, 2005

(30) Foreign Application Priority Data
Jul. 2, 2003    (KR) ...................... 10-2003-0044679

(51) Int. Cl.
*H01L 21/00* (2006.01)
*B08B 7/00* (2006.01)
(52) U.S. Cl. .................. 156/345.11; 134/198; 134/902
(58) Field of Classification Search ................ 134/113, 134/135, 137; 156/345.55, 345.11
See application file for complete search history.

(56) References Cited
U.S. PATENT DOCUMENTS

| | | | | |
|---|---|---|---|---|
| 4,968,375 A | * | 11/1990 | Sato et al. ............. | 156/345.23 |
| 5,351,360 A | * | 10/1994 | Suzuki et al. ................. | 15/302 |
| 5,365,031 A | * | 11/1994 | Mumola ................ | 219/121.43 |
| 5,639,311 A | * | 6/1997 | Holley et al. .................. | 134/6 |
| 5,868,857 A | * | 2/1999 | Moinpour et al. ............. | 134/6 |
| 5,947,134 A | * | 9/1999 | Kim et al. ................ | 134/57 R |
| 5,976,267 A | * | 11/1999 | Culkins et al. ................ | 134/6 |
| 6,055,694 A | * | 5/2000 | Steere ........................... | 15/77 |
| 6,805,769 B2 | * | 10/2004 | Okuda et al. .......... | 156/345.12 |
| 6,827,814 B2 | * | 12/2004 | Taniyama et al. ...... | 156/345.12 |

* cited by examiner

*Primary Examiner*—Parviz Hassanzadeh
*Assistant Examiner*—Sylvia R. MacArthur
(74) *Attorney, Agent, or Firm*—Marger Johnson & McCollom, P.C.

(57) ABSTRACT

An apparatus for treating an edge of a semiconductor substrate includes an etchant supply nozzle for supplying a first etchant to the edge of the semiconductor substrate. The apparatus further includes a shielding cover for preventing an etchant from flowing to a shielding surface of the semiconductor substrate. The shielding cover is movable in an upward and downward direction. The apparatus also includes a device for cleaning the edge of the semiconductor substrate. According to the apparatus, after a wafer edge is etched, foreign substances remaining at the wafer edge is efficiently removed.

19 Claims, 11 Drawing Sheets

APPARATUS AND METHOD FOR TREATING EDGE OF SUBSTRATE

This application claims the priority of Korean Patent Application No. 2003-44679, filed on Jul. 2, 2003 in the Korean Intellectual Property Office, the disclosure of which is incorporated herein in its entirety by reference.

BACKGROUND OF THE INVENTION

1. Field of the Invention

The present invention relates to apparatus and method for manufacturing semiconductor devices and, more particularly, to apparatus and method for removing and cleaning layers left at the edge of a substrate.

2. Description of Related Art

To manufacture semiconductor devices, a plurality of layers such as oxide, nitride, and metal are stacked on a semiconductor substrate such as a wafer. After a photoresist film is coated on these layers, a pattern formed at a reticle is transcribed onto the wafer. This process is called a photolithographic process. Thereafter, only a desired pattern is left on the wafer. If layers (oxide, nitride, metal, and photoresist) are left at the edge and bevel portion of the wafer, the layer of a wafer holding portion drops therefrom to float in a semiconductor manufacturing equipment when the wafer is held by means of an arm while transferring the wafer in a subsequent process. The floating layer acts as a particle.

For this reason, a process for removing these layers left at the wafer edge is needed. Conventionally, at the top surface of a pattern-formed wafer, a portion of the wafer which is not a wafer edge to be etched is shielded by a shielding solution or mask. Thereafter, an etchant is injected onto an entire surface of the wafer, or the wafer is submerged in an etchant-containing bath. Unfortunately, such a conventional manner includes additional steps of shielding a pattern-formed portion by the shielding solution or the mask and re-removing the pattern-formed portion after etching. This results in a substantial amount of lost work time and the use of a significant amount of the etchant material in order to perform the above-described additional steps.

Moreover, these layers may be incompletely removed even after the etch process. In this case, these layers remain as a fine protrusion formed at the bevel portion of the wafer. If a polysilicon layer and a nitride layer remain at the level of the wafer, after a storage node is separated, foreign substances of these layers stream between storage nodes when an oxide layer deposited on the layers is wet etched. Thus, a bridge is established between transistors which reduces the total yield of the product.

SUMMARY OF THE INVENTION

In view of the foregoing, the present invention provides apparatus and method for efficiently removing unnecessary layers remaining on the edge of a wafer.

In one embodiment, an apparatus for treating an edge of a semiconductor substrate includes an etchant supply nozzle for supplying a first etchant to the edge of the semiconductor substrate. The apparatus further includes a shielding cover for preventing an etchant from flowing to a shielding surface of the semiconductor substrate. The shielding cover is movable in an upward and downward direction. The apparatus also includes a device for cleaning the edge of the semiconductor substrate. According to the apparatus, after a wafer edge is etched, foreign substances remaining at the wafer edge is efficiently removed.

BRIEF DESCRIPTION OF THE DRAWINGS

These and other objects, features and advantages of the present invention will be readily understood with reference to the following detailed description thereof provided in conjunction with the accompanying drawings, wherein like reference numerals designate like structural elements, and in which.

DETAILED DESCRIPTION OF THE INVENTION

Figure 1A:
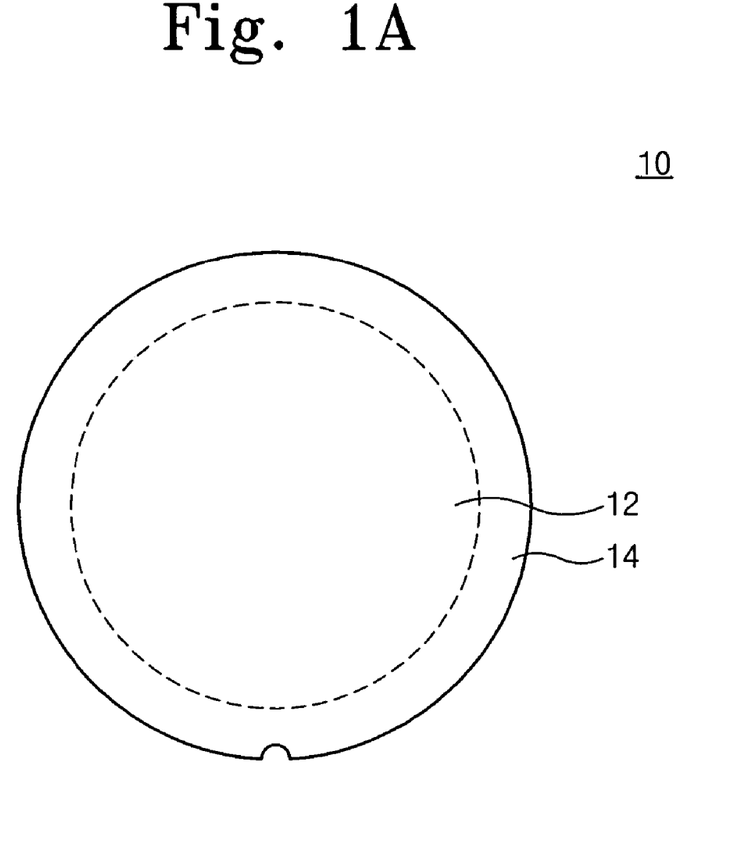
FIG. 1A and FIG. 1B are a front view and a side view of a wafer, respectively.
Figure 1B:
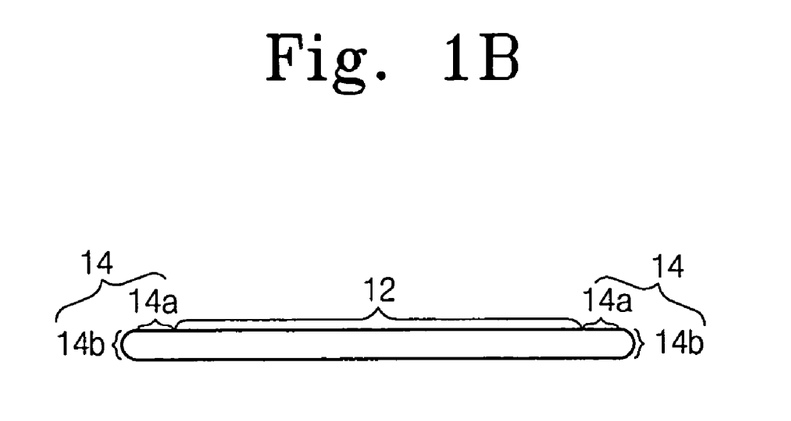

A wafer 10 will now be defined with reference to FIG. 1A and FIG. 1B. In this embodiment, a top surface of the wafer 10 is a surface on which a pattern is formed, and a bottom surface thereof means the other surface. Further, a shielding surface 12 of the wafer 10 means a surface within the confines of a wafer edge 14, in which incomplete chips are disposed. The shielding surface 12 is shielded from an etchant sprayed to the wafer edge 14. The wafer edge 14 comprises an upper edge 14a corresponding to a top surface edge of the wafer 10 and an edge bevel portion 14b corresponding to a portion protruding from a lateral side of the wafer 10.

Figure 2:
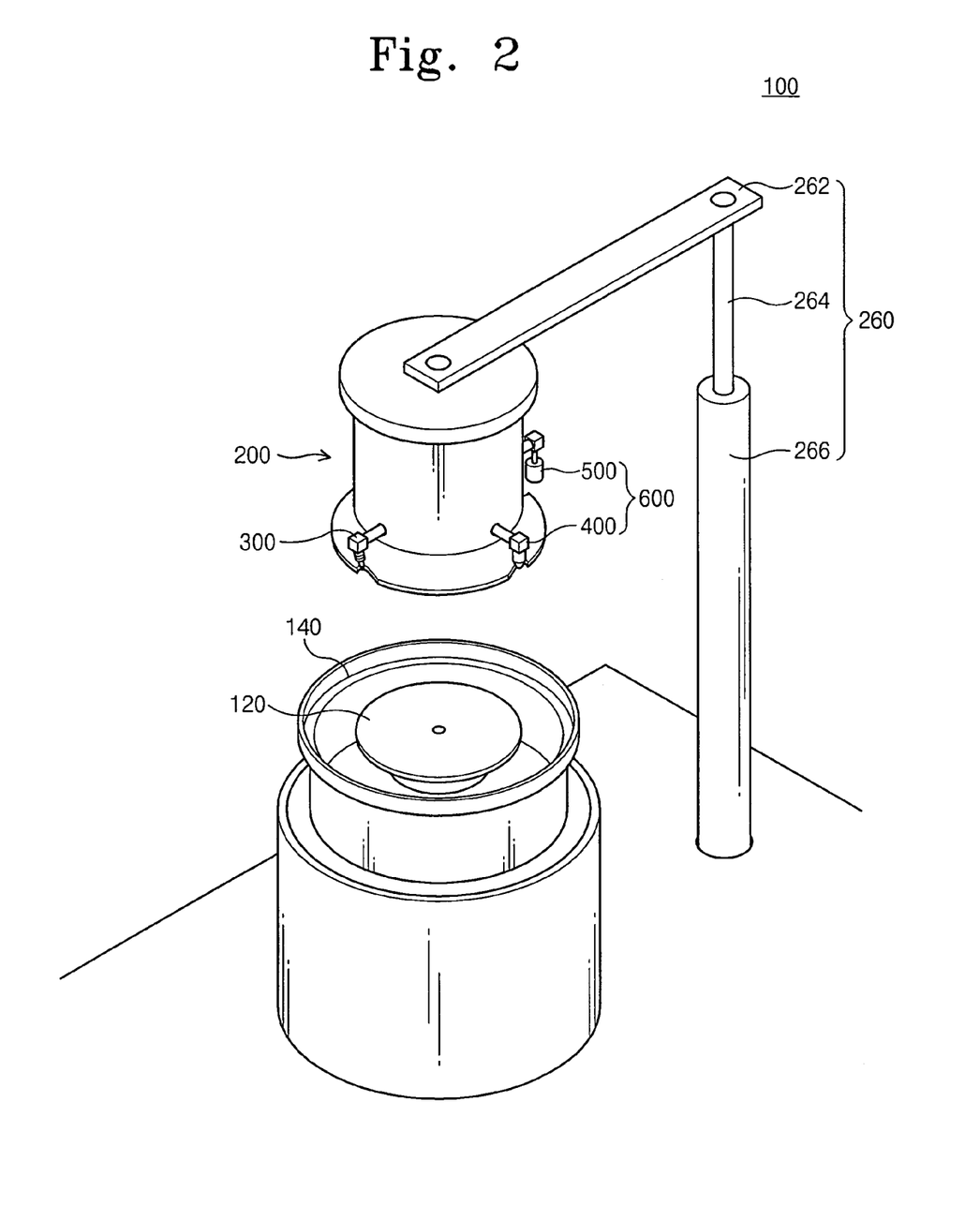
FIG. 2 is a perspective view of a wafer edge treating apparatus according to an embodiment of the present invention.

Referring to FIG. 2, a semiconductor substrate edge treating apparatus 100 includes a susceptor 120, a shielding cover 200, an etchant spray part 300, and a cleaning device 600. The susceptor 120 may be a circular plate on which a wafer 10 is placed. The wafer 10 may be fixed to the susceptor 120 by means of a clamp which functions as a mechanical fixing device. Alternatively, the wafer 10 may be fixedly held in place with respect to the susceptor 120 by a vacuum. A supporting rod (not shown) whose one end is fixed to the susceptor 120 is disposed below the susceptor 120 and may be rotated in conjunction with a susceptor 120 by means of a motor (not shown) during a process. A bowl 140 may be disposed to surround an outer periphery of the susceptor 120 and prevents an etchant from splashing to the circumference of the susceptor 120 during the process. The bowl 140 has an open top side.

The shielding cover 200 prevents the etchant supplied to the wafer edge 14 from flowing to the shielding surface 12 and has a shielding body 220, a housing 240, and a shielding body moving part 260.

Figure 3:
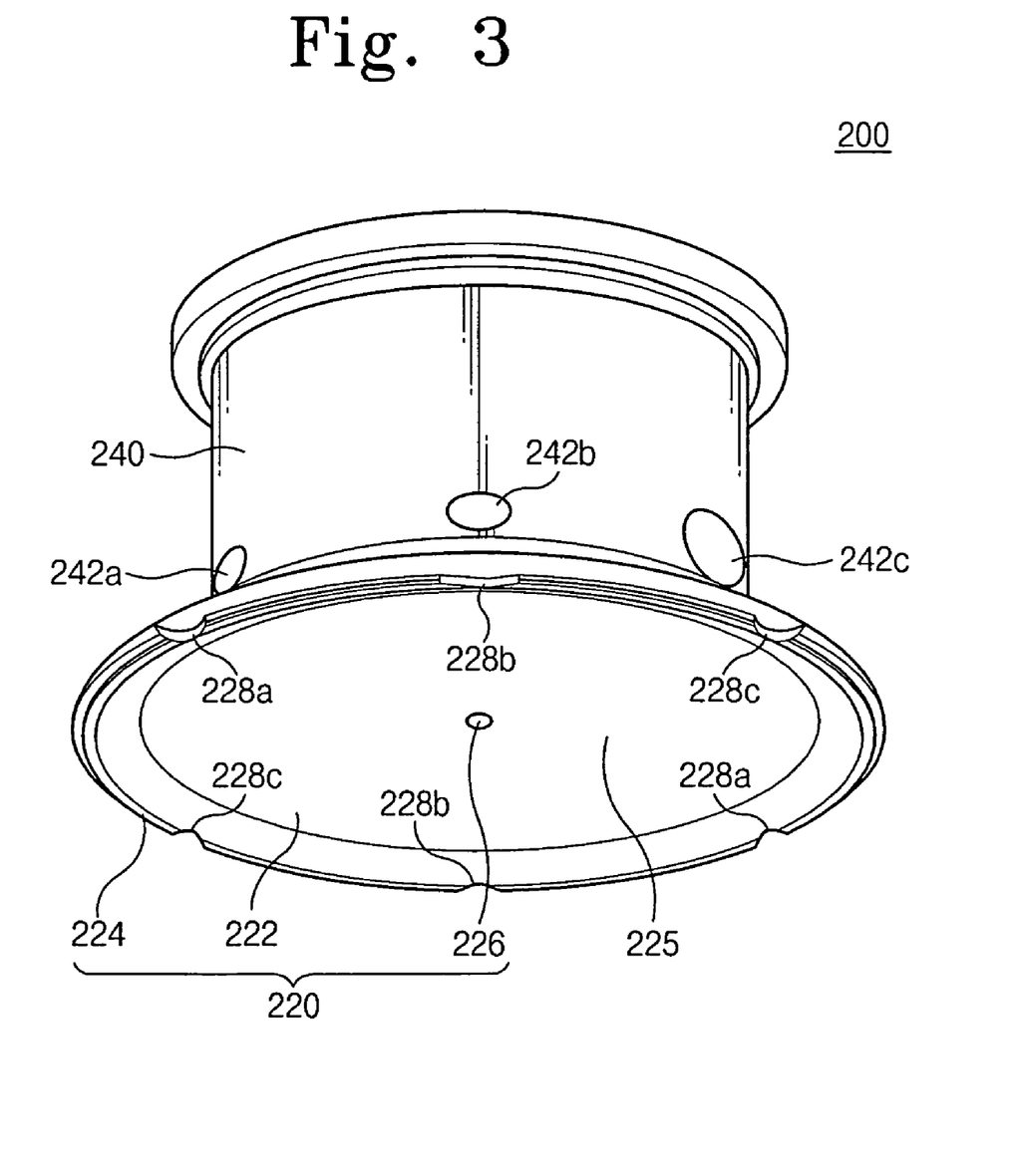
FIG. 3 is a perspective view of a shielding body and a housing, viewed from a lower position.

Referring to FIG. 3, the shielding body 220 is opposite to a wafer top surface to directly shield the shielding surface 12 from an etchant. The housing 240 upwardly extends from the shielding body 220. A driving device for moving an etchant spray nozzle 320, a cleaner nozzle 420, and a brush 510 is inserted into the housing 240, all of which will be explained in further detail later.

The shielding body 220 is a circular body having a flat plate type central portion 222 and an edge where a ring-shaped protrusion 224 is formed to protrude downwardly. The protrusion 224 has the same size as the shielding surface 12. During the process, the protrusion 224 is spaced apart from the shielding surface 12 at a preset interval. Therefore, a predetermined space is provided between the shielding surface 12 and a bottom 225 of the shielding body 220. A spray port 226 for spraying inert gas such as nitrogen into the space is formed at the center of the bottom 225. The inert gas prevents the etchant supplied to the outside of the protrusion 224 from flowing into the space.

The housing 240 is connected to the shielding body moving part 260 that vertically moves up and down. Although the housing is widely spaced apart from the susceptor 120 before a process, it is narrowly spaced apart from a wafer 10 placed at the susceptor 120. The shielding body moving part 260 may have a supporting arm 262 and a moving rod 264. One end of the supporting arm 262 is connected to a top side of the housing 240. The moving rod 264 is connected to the other end of the supporting arm 262 to straightly vertically move by means of a hydraulic/pneumatic cylinder (not shown). The moving rod 264 is inserted into a hollow cylindrical guide 266 to move along a passage in the guide 264.

Figure 4:
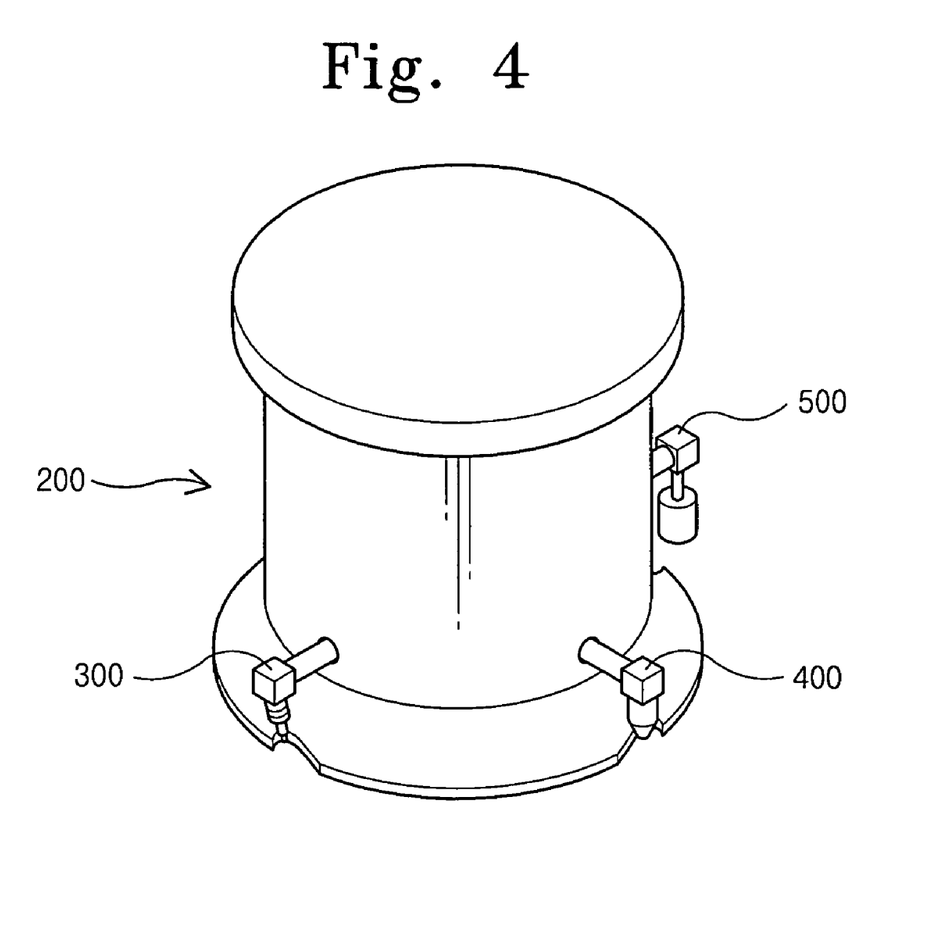
FIG. 4 is a perspective view of a shielding cover to which an etchant spray part and a cleaning device are coupled.
Figure 5:
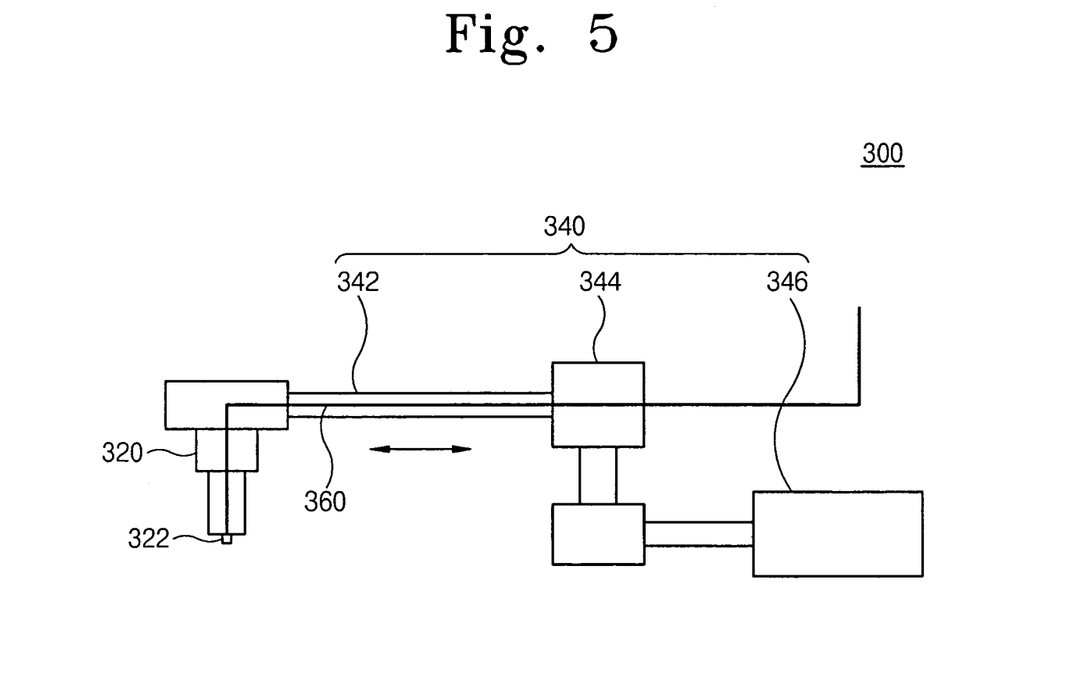
FIG. 5 is a schematic view showing the configuration of the etchant spray part.

FIG. 4 shows a shielding cover to which an etchant spray part and a cleaning device are coupled, and FIG. 5 shows the configuration of the etchant spray part. An etchant spray part 300 sprays an etchant to a wafer edge 14. Referring to FIG. 5, the etchant spray part 300 has an etchant spray nozzle 320, an etchant supply line 360, and a nozzle moving part 340. The etchant spray nozzle 320 is disposed over a wafer edge and has a spray port 322 that may be disposed in a substantially vertical position with respect to the wafer 10 or may be inclined outwardly toward the wafer 10. The spray port 322 may be inserted into a groove 228a formed at the outermost portion of a shielding body (an outer portion of the foregoing protrusion-formed portion) or may be on the groove 228a. The etchant spray nozzle 320 sprays an etchant that is suitable to etch an upper layer formed at the wafer edge 14. For example, if the upper layer is made of oxide, an etchant sprayed from the etchant spray nozzle 320 may be hydrogen fluoride (HF).

The etchant spray nozzle 320 may horizontally move by means of the nozzle moving part 340. The nozzle moving part 340 may have a supporting rod 342 for supporting the etchant spray nozzle 320 and a bracket 344 connected to the supporting rod 342 and to be moved by means of the nozzle driving device 346 which can be a hydraulic/pneumatic cylinder. The structure of the nozzle moving part 340 is merely exemplary, and the nozzle moving part 340 may have various structures and mechanisms within the spirit and the scope of the present invention. The supporting rod 346 is inserted through a hole 242a formed at a sidewall of the housing 240, and the driving device 346 may be disposed in the housing 240. The etchant supply line 360 defines the path of the etchant supplied to the etchant spray nozzle 320 and may be provided by forming a hole in the supporting rod 342. A plurality of etchant spray parts may be provided for shortening the time required for a process.

The cleaning device 600 is a part for cleaning the wafer edge 14 etched by the etchant spray nozzle 320. The cleaning device 600 has a pure water supply unit 400 and a brush cleaning device 500. The pure water supply unit sprays pure water to the wafer edge 14 to perform a clean process, and the brush cleaning device 500 performs a cleaning process by means of a rotating brush.

Figure 6:
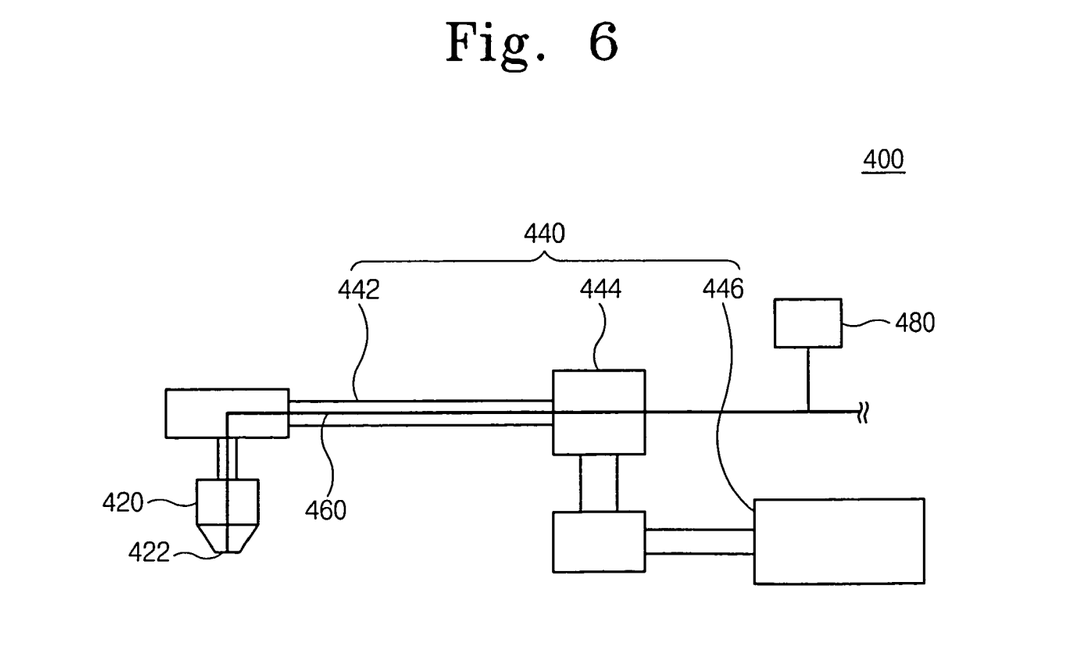
FIG. 6 is a schematic view showing the configuration of a pure water supply unit.

Referring to FIG. 6, the pure water supply unit 400 has a cleaner nozzle 420, a cleaner nozzle moving part 440 for straightly moving the cleaner nozzle 420, a pure water supply line 460 connected to the cleaner nozzle 420, and a megasonic generator 480 for applying a megasonic wave to a fluid flowing through the pure water supply line 460. A cleaning process using the pure water supply unit 400 may be performed after an etch process is completed, or pure water may be sprayed during a cleaning process using a brush that will be described later.

A spray port 422 of the cleaner nozzle 420 is disposed over a groove 228b formed at the edge of a shielding body and is in vertical alignment with the wafer 10 or to be inclined thereto at an angle. The cleaner nozzle 420 may be moved by means of the cleaner nozzle moving part 440. The cleaner nozzle moving part 440 has a supporting arm 442 connected to the cleaner nozzle 420 and a bracket 444 which is moved in a straight line by means of the cleaner nozzle driving device 446. The supporting arm 442 is attached to the bracket 444.

The supporting arm 442 is inserted through a hole 242b formed at a housing sidewall, and a cleaner nozzle driving device may be disposed in the housing. The pure water supply line 460 provides a path of pure water which is supplied to the cleaner nozzle 420 and may be in the form of a hole in the supporting arm 442. The megasonic generator 460 applies a megasonic wave to a fluid flowing through the cleaner nozzle 420 or the pure water supply line 460 to supply pure water to the wafer 10. A plurality of pure water supply units may be provided for shortening the time required for a process.

Figure 7:
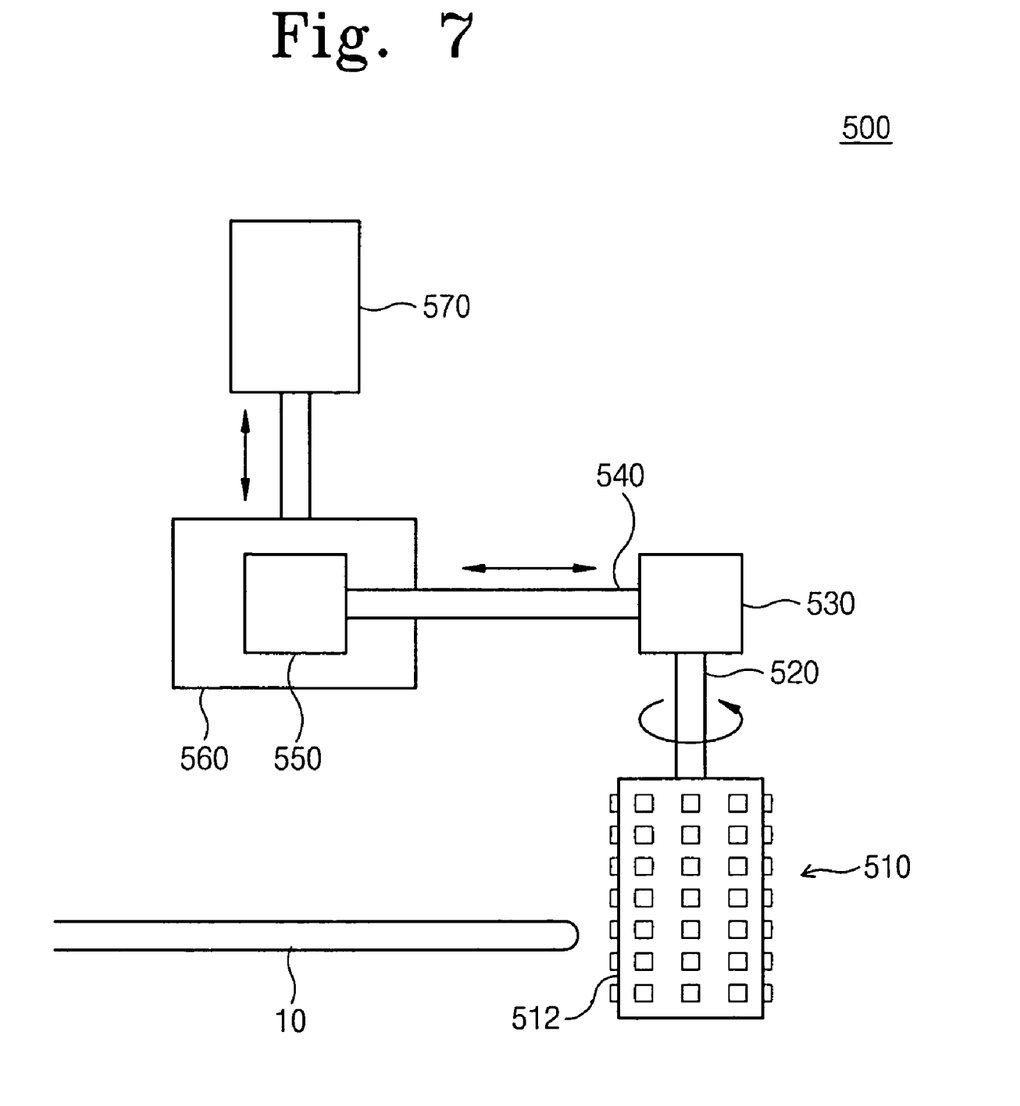
FIG. 7 is a schematic view showing an embodiment of a brush cleaning device.

The brush cleaning device 500 cleans an edge bevel portion of a wafer. A first embodiment of the brush cleaning device 500 is schematically illustrated in FIG. 7. The brush cleaning device 500 has a brush 510, a shaft 520, a rotating driving device 530, a horizontal driving device 550, a vertical driving device 570, and an etchant supply unit 580. The shaft 520 is aligned vertically with respect to the wafer 10. The brush 510 is inserted into an external lateral portion of the shaft 520. The brush 510 is a tube-type brush but may be a brush having an alternative configuration. Both ends of the shaft 520 have larger sections than the central portion thereof in order to be affixed to the brush 510. The brush 510 may be made of polyvinyl alcohol (PVA).

A rotating driving device 530 such as a motor is connected to one end of the shaft 520 to rotate the shaft 520. The motor 530 is also connected to a supporting arm 540 that horizontally moves by means of a horizontal driving device 550.

The supporting arm 540 is formed of a cylindrical rod and is inserted through a hole 242c formed at the lateral side of a housing 240 of a shielding cover part.

When a brush cleaning process is carried out, the supporting arm 540 moves inwardly toward the housing 240 so that the lateral side of the brush 510 is in contact with an edge bevel portion 14b of a wafer. When the brush cleaning process is not carried out, the supporting arm 540 moves outwardly toward the housing 240 such that the lateral side of the brush 510 is spaced apart from the edge bevel portion 14b of the wafer. The brush cleaning device 500 has a vertical driving device 570 for moving up and down the bracket 560 to which the horizontal driving device 550 is connected so as to move the brush 510 upwardly and downwardly. Due to the vertical driving device 570, all regions of the brush 510 are in uniform contact with the edge bevel portion 14b of the wafer in order to reduce damage to the brush 510 during the process.

Figure 8:
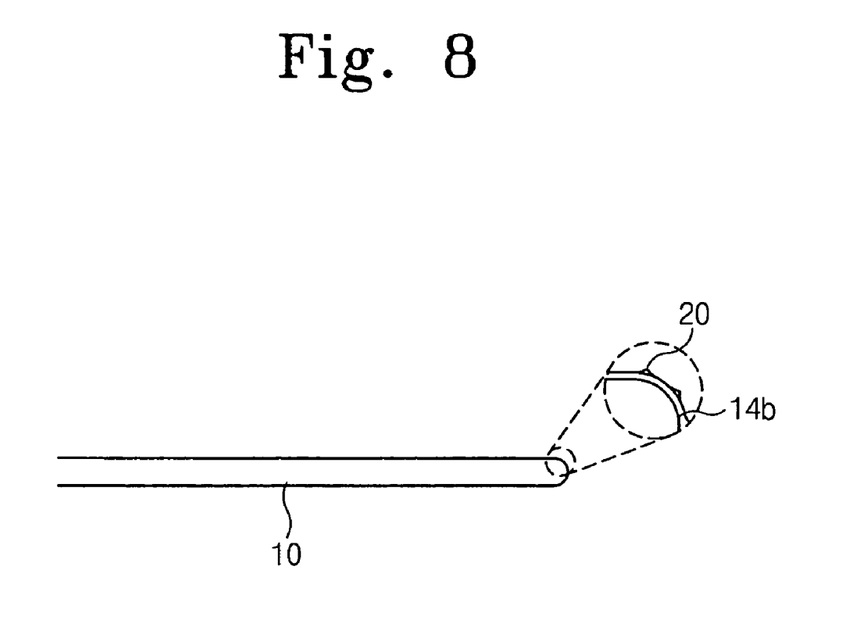
FIG. 8 is an enlarged view showing a layer that partially remains at a bevel portion of a wafer edge.

When an etchant is sprayed from the etchant supply unit 300 to the wafer edge 14 to start an etch process, a partially unetched layer 20 exists at the edge bevel portion 14b of the wafer, as shown in FIG. 8. In the case where the layer 20 is made of polysilicon or nitride, several disadvantages can occur. When a layer of oxide such as BPSG is deposited on a polysilicon or nitride layer, and a storage node is separated in a subsequent process, and then the oxide layer is wet etched, the polysilicon or nitride layer flows into storage nodes among patterns formed in a shielding surface to cause a bridge between transistors. In order to prevent the bridge formation, an etchant supply unit 580 is provided. The etchant supply unit 580 supplies an etchant to the brush 510 to remove the polysilicon or nitride layer remaining at the edge bevel portion 14 of the wafer. The etchant is, for example, nitric acid or hydrogen fluoride (HF). The etchant supply unit 580 has a main supply path 582, a sub-supply path 584, and an etchant supply line 586.

Figure 9:
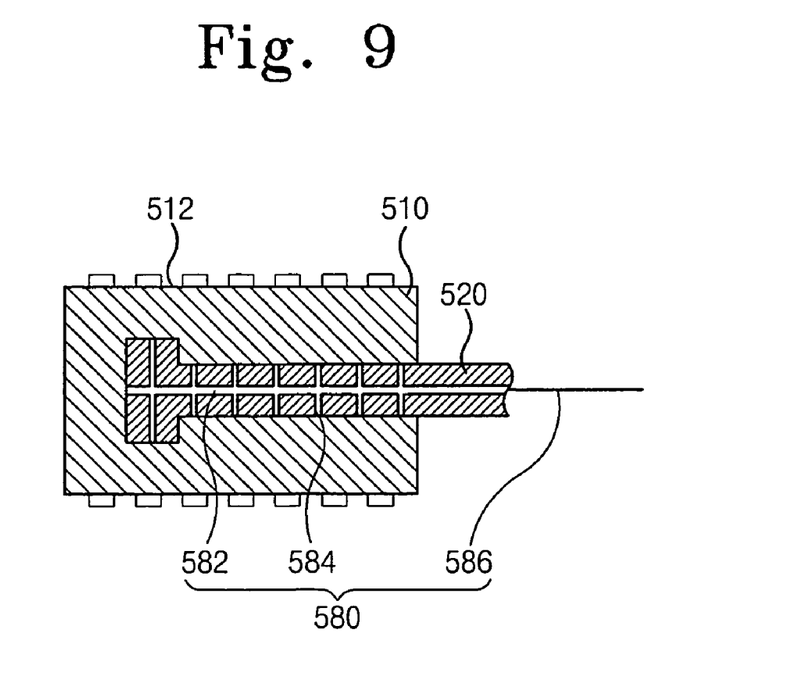
FIG. 9 is a cross-sectional view of a shaft, showing the etchant supply unit.

Referring now to FIG. 9, the main supply path 582 is formed in a shaft 520 and inserted into the brush 510 in the lengthwise direction of the shaft 520. The sub-supply path 584 extends from the main supply path 582, in the radial direction of the shaft 520, to penetrate an external sidewall of the shaft 520, and is formed at a portion surrounded by the brush 510. One end of the etchant supply line 586 is connected to an etchant storing part (not shown), and the other end thereof is connected to the main supply path 582. While the etchant seeps into the brush 510 through the etchant supply line 586, the main supply path 582, and the sub-supply path 584, the brush 510 moves up and down to remove and clean any residual layer remaining at the edge bevel portion 14b of the wafer.

In this embodiment, the etchant spray part 300, the pure water supply unit 400, and the brush cleaning device 500 are connected to the housing 240. But this embodiment is merely an exemplary embodiment, and they may be connected to a frame or a base disposed around the susceptor 120 or the shielding cover part 200.

Figure 10:
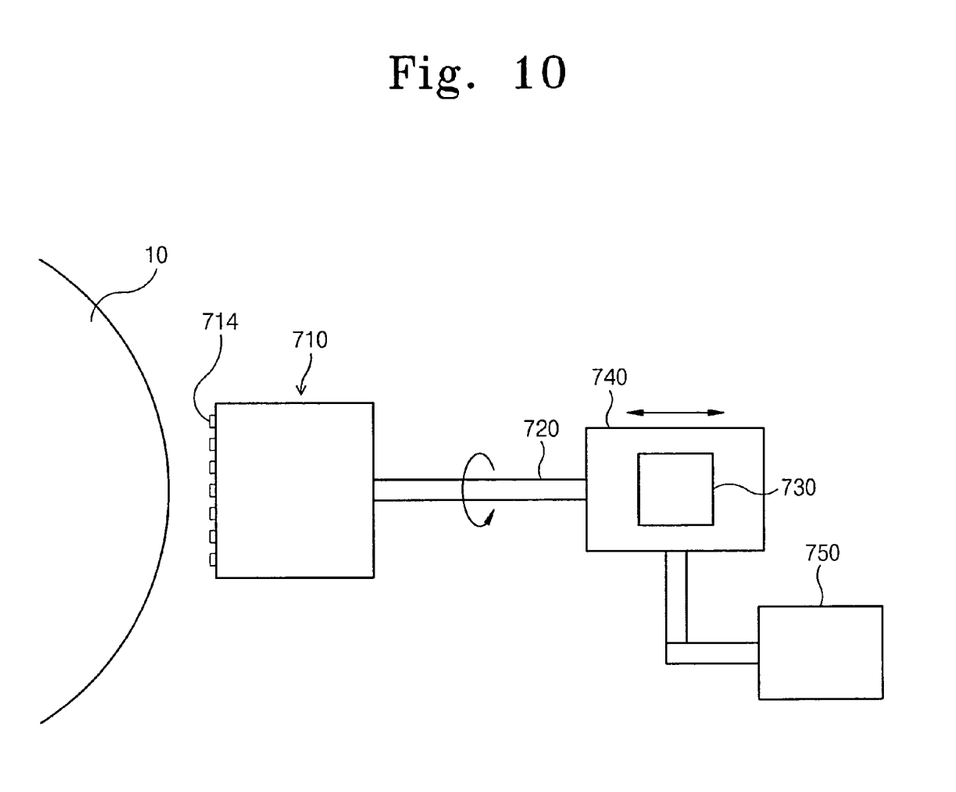
FIG. 10 is a schematic view showing another embodiment of the brush cleaning device shown in FIG. 7.

The brush 510 may be designed according to process conditions, the state and kind of foreign substances to be removed, and so forth. A modified example of the brush cleaning device 500 according to the first embodiment is illustrated in FIG. 10. Referring to FIG. 10, a brush cleaning device 700 has a brush 710, a shaft 720, a rotating driving device 730, a horizontal driving device 750, and an etchant supply unit (not shown). The shaft 720 is spaced apart from a wafer 10 in a radical direction of the wafer 10. The rotating driving device 730 can include a motor for rotating one end of the shaft 720. The motor of driving device 730 is installed at a bracket 740 that moves in the radial direction of the wafer 10 by means of the horizontal driving device 750. One side of the shaft 720 is inserted into the brush 710. While an etchant supplied through an etchant supply path seeps into the brush 710. A cleaning process using the brush 710 is then carried out. Similar to the first embodiment, the etchant supply path comprises a main supply path and sub-supply paths formed in the shaft 720, and an etchant supply line connected to the main supply path. In this modified embodiment, the brush 710 moves by means of the horizontal moving part 750 such that a front side 714 of the brush 710 is in contact with the edge bevel portion 14b of a wafer 10. Thereafter, the brush 710 is rotated while the etchant seeps thereinto.

Figure 11A:
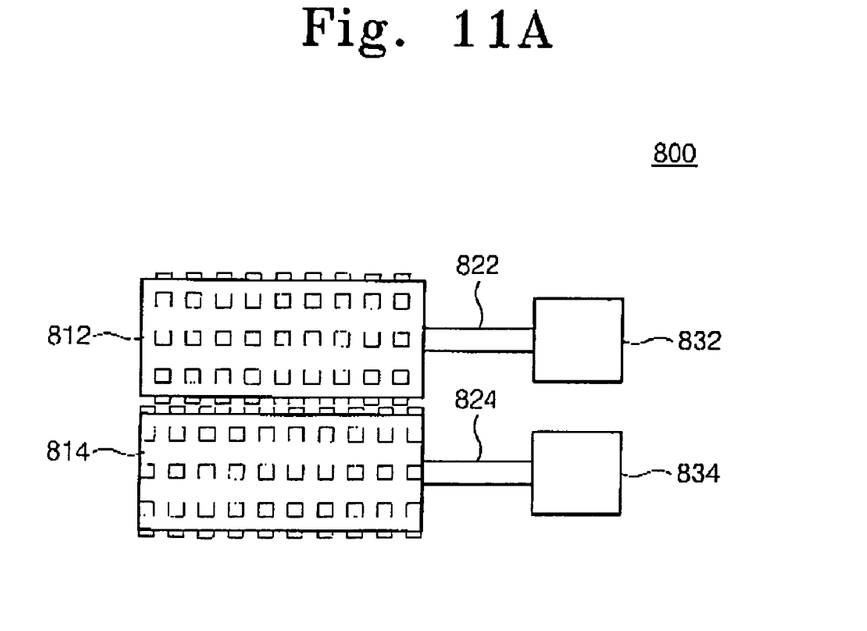
FIG. 11A is a schematic view showing a yet another embodiment of the brush cleaning device.
Figure 11B:
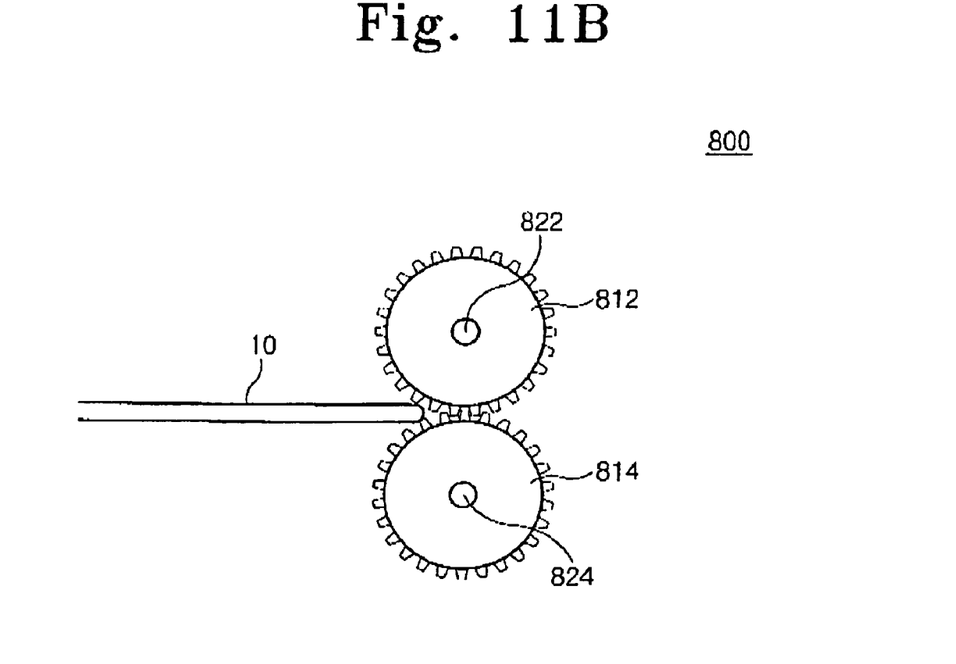
FIG. 11B is a schematic view showing that the bevel portion of the wafer edge is cleaned when the brush cleaning device of FIG. 11A is used.

Referring to FIG. 11A and FIG. 11B, the brush cleaning device 800 has an upper brush 812 and a lower brush 814. The area between the lower brush 814 and the upper brush 812 is disposed opposite the wafer 10. Lateral sides of the upper and lower brushes 812 and 814 are disposed to partially overlap with each other. An edge bevel portion of the wafer 10 is inserted into a concave area formed between the upper and lower brushes 812 and 814. An upper shaft 822 one end of which is connected to a rotation motor 832 is inserted at the other end into the upper brush 812. A lower shaft 824 one end of which is connected to a rotation motor 834 is inserted at the other end into the lower brush 814. The rotation motor 832 is connected to a moving part (not shown) for moving the upper brush 812 in a radial direction with respect to the wafer 10 such that the upper brush 812 is in contact with or spaced apart from the wafer edge bevel portion 14. The rotation motor 834 is connected to a horizontal moving part (not shown) for moving the lower brush 814 in the direction toward the wafer 10 during a brush cleaning process.

Although it is illustrated in these figures that an edge bevel portion of the wafer 10 is in contact with an upper brush and a lower brush, an upper edge and a lower edge of the wafer 10 may be in contact therewith.

Figure 12:
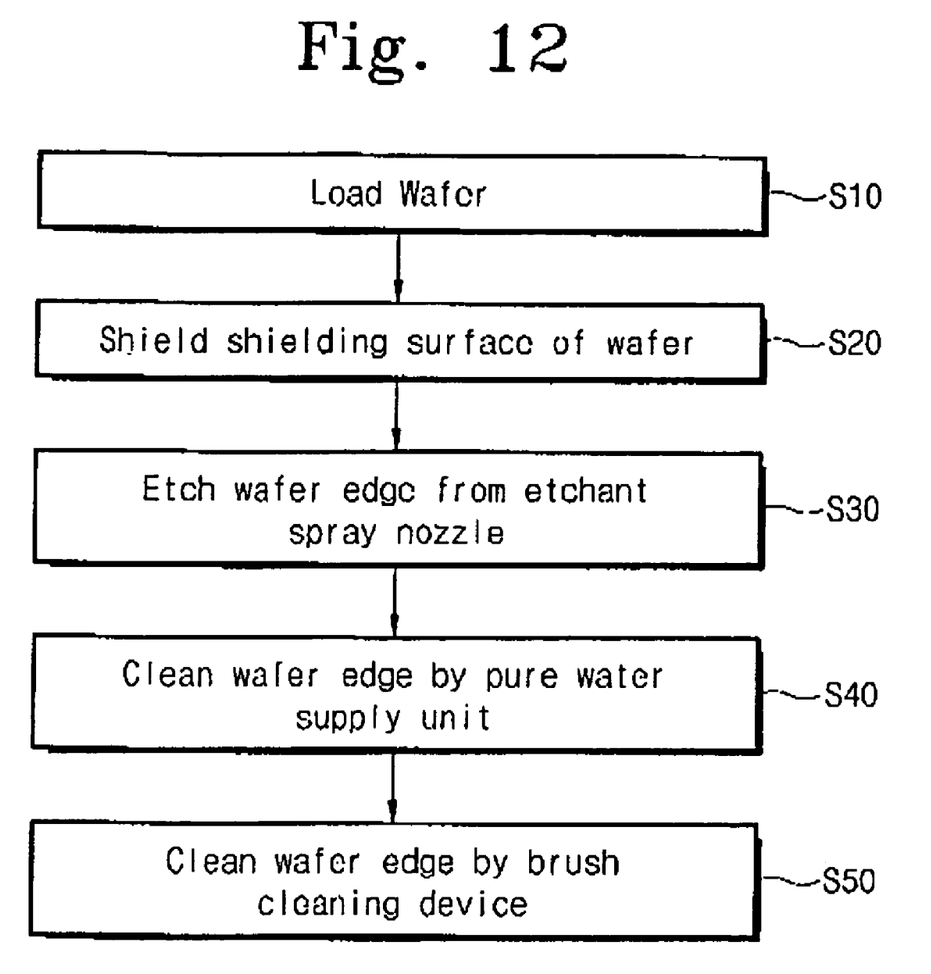
FIG. 12 is a flowchart for explaining a wafer edge treating method according to a still another embodiment of the present invention.
Figure 13:
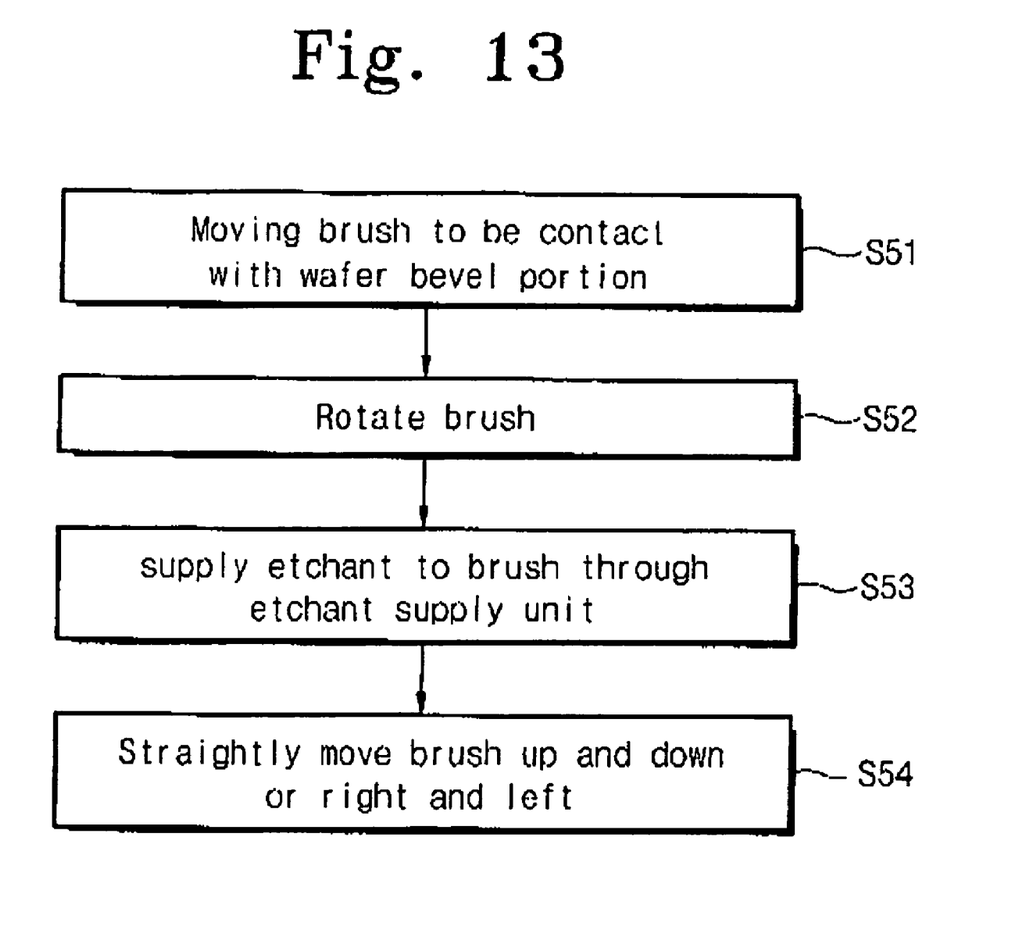
FIG. 13 is a flowchart for explaining a cleaning process using the brush cleaning device according to another embodiment of the present invention.

Referring to FIG. 12 and FIG. 13, loading is accomplished when a shielding body 220 moves up, and a wafer 10 is placed on a susceptor 120 by means of a transfer arm (not shown) (S10). The shielding body 220 is moved down to be spaced apart from the wafer 10 at a predetermined interval, and a nitrogen gas is sprayed through a spray port 226 formed at the shielding body 220 (S20). An etchant is sprayed through an etchant spray nozzle 320 and the susceptor 120 is rotated at a regular speed to start etching a wafer edge 14 (S30). Pure water is supplied to the wafer edge 14 through a cleaner nozzle 420 to start a cleaning process (S40). When the cleaning process using the pure water is completed, a cleaning process is performed by means of a brush 510 (S50). During the cleaning process using the brush 510, the pure water may be continuously sprayed from the cleaner nozzle 420.

The cleaning process using a brush will now be described more fully per the flowchart in FIG. 13. After a lateral side 512 of the brush moves in contact with an edge bevel portion 14b of a wafer, a shaft 520 is rotated to start a cleaning process (S51 and S52). While the cleaning process is performed by means of a brush cleaning device 500, pure water may be continuously supplied from the cleaner nozzle 420. When the cleaning process is performed by means of the brush cleaning device 500, an etchant such nitric acid or hydrogen fluoride is supplied to the brush 510 through an etchant supply unit 580 formed in the shaft 520 (S53). During the cleaning process, the brush moves horizontally or vertically to enable the wafer edge 14 to be sequentially in contact with the end of the brush lateral side (S54). Thus, the brush cleaning device 500 may clean the wafer edge 14 while removing layers remaining at a wafer edge bevel portion.

After a wafer edge is etched, foreign substances remaining at the wafer edge can be rapidly removed. When the wafer edge is etched, layers which remain partially unetched at an edge bevel portion can be completely removed. Therefore, it is possible to prevent a bridge from establishing between transistors when these layers flow between storage nodes in a subsequent process. As a result, a process error caused by the bridge will not occur.

Although the exemplary embodiments of the present invention have been described in detail, it should be understood that many variations and/or modifications of the basic inventive concepts herein taught, which may appear to those skilled in the art, will still fall within the spirit and scope of the present invention as defined in the appended claims.

What is claimed is:

1. An apparatus for treating an edge of a semiconductor substrate, comprising:
    an etchant supply nozzle for supplying a first etchant to an edge of a semiconductor substrate for removing unnecessary layers remaining on the edge;
    a shielding cover for preventing the first etchant from flowing to a shielding surface of the semiconductor substrate; and
    a device for cleaning the edge of the semiconductor substrate, wherein the cleaning device comprises a brush cleaning device for performing a semiconductor substrate cleaning process, the brush cleaning device including a brush, a shaft inserted into the brush and disposed substantially perpendicular to the semiconductor substrate, a driving device pivotally rotating the shaft, and a part for moving the brush perpendicular to the semiconductor substrate during the cleaning process by the brush.

2. The apparatus as recited in claim 1, wherein the cleaning device includes a water supply unit for supplying water to the edge of the semiconductor substrate.

3. The apparatus as recited in claim 1, wherein the shielding cover is movable in an upward and downward direction.

4. The apparatus as recited in claim 3, wherein the brush cleaning device is connected to the shielding cover.

5. The apparatus as recited in claim 1, wherein the brush cleaning device further comprises an etchant supply device for supplying a second etchant to the brush.

6. The apparatus as recited in claim 5, wherein the etchant supply device comprises:
    a main supply path formed in the shaft;
    sub-supply paths extending from the main supply path to a circumferential portion of the shaft; and
    a supply line for supplying the second etchant to the main supply path.

7. An apparatus for treating the edge of a semiconductor substrate, comprising:
    a susceptor on which a semiconductor substrate is supported;
    a first etchant supply nozzle for supplying a first etchant to the edge of the semiconductor substrate for removing unnecessary layers remaining on the edge;
    a shielding cover for shielding the inflow of an external fluid from a shielding surface of the semiconductor substrate, the shielding cover being disposed over the susceptor to move up and down; and
    a brush cleaning device for cleaning the edge of the semiconductor substrate which comprises a brush, a shaft inserted into the brush for rotating the brush, a path for supplying a second etchant to the brush being formed in the shaft, and a driving device for pivotally rotating the shaft.

8. The apparatus as recited in claim 7, further comprising a water supply nozzle for supplying water to the edge of the semiconductor substrate.

9. The apparatus as recited in claim 8, wherein the edge comprises a beveled edge.

10. The apparatus as recited in claim 8, wherein the first etchant supply nozzle is coupled to a shielding cover.

11. The apparatus as recited in claim 7, wherein the shaft is disposed substantially perpendicular to the semiconductor substrate, wherein the edge further comprises an edge bevel portion of the semiconductor subsstrate, and wherein the the edge bevel portion is configured to be in contact with a lateral side of the brush.

12. The apparatus as recited in claim 11, which further includes a part for the brush perpendicular to the semiconductor substrate during the cleaning process by the brush.

13. The apparatus as recited in claim 7, wherein the shaft is disposed outside the edge of the semiconductor substrate, wherein the edge further comprises an edge bevel portion of the semiconductor substrate, and the edge bevel portion is configured to be in contact with a front side of the brush.

14. The apparatus as recited in claim 7, wherein the brush cleaning device comprises:
    an upper brush into which an upper shaft is inserted; and
    a lower brush into which a lower shaft is inserted, the lower brush being either in contact with the upper brush or spaced apart therefrom,
    wherein the edge further comprises an edge bevel portion of the semiconductor substrate, and the bevel portion of the semiconductor substrate is inserted between and in contact with the upper and lower brushes.

15. The apparatus as recited in claim 14, wherein the brush cleaning device further comprises driving devices for horizontally moving the upper and lower brushes during the cleaning process.

16. The apparatus as recited in claim 7, wherein the brush cleaning device further comprises an etchant supply device for supplying a second etchant to the brush.

17. The apparatus as recited in claim 16, wherein the etchant supply device comprises:
    a main supply path formed in the shaft;
    sub-supply paths extending from the main supply path to a circumferential portion of the shaft; and
    a supply line for supplying the second etchant to the main supply path.

18. The apparatus as recited in claim 7, wherein the first etchant supply nozzle is coupled to a shielding cover.

19. An apparatus for treating an edge of a semiconductor substrate, comprising:
    an etchant supply nozzle for supplying a first etchant to an edge of a semiconductor substrate for removing unnecessary layers remaininit on the edge;
    a shielding cover for shielding the inflow of an external fluid from a shielding surface of the semiconductor substrate, the shielding cover being disposed over the susceptor to move up and down; and
    a device for cleaning the edge of the semiconductor substrate which includes a part for moving the brush perpendicular to the semiconductor substrate during the cleaning process by the brush.

* * * * *

UNITED STATES PATENT AND TRADEMARK OFFICE
CERTIFICATE OF CORRECTION

PATENT NO.         : 7,166,183 B2                                      Page 1 of 1
APPLICATION NO.    : 10/884533
DATED              : January 23, 2007
INVENTOR(S)        : Chang-Hyeon Nam et al.

It is certified that error appears in the above-identified patent and that said Letters Patent is hereby corrected as shown below:

On the Title Page, Item (75)
Inventor "Seung-Kim LEE" should read -- Seung-Kun LEE --;
Column 8, line 12, the word "subsstrate" should read -- substrate --;
Column 8, line 12, the words "the the" should read -- the --;
Column 8, line 16, the words "for the" should read -- for moving the --;
Column 8, line 56, the word "remaininit" should read -- remaining --.

Signed and Sealed this

Twenty-first Day of October, 2008

JON W. DUDAS
*Director of the United States Patent and Trademark Office*